(12) United States Patent
Le Feuvre et al.

(10) Patent No.: US 8,229,527 B2
(45) Date of Patent: Jul. 24, 2012

(54) VACUUM VESSEL FOR COOLED EQUIPMENT

(75) Inventors: Mark James Le Feuvre, Oxford (GB); Edgar Charles Malcolm Rayner, Oxon (GB)

(73) Assignee: Siemens Plc, Frimley, Camberley (GB)

( * ) Notice: Subject to any disclaimer, the term of this patent is extended or adjusted under 35 U.S.C. 154(b) by 525 days.

(21) Appl. No.: 12/428,976

(22) Filed: Apr. 23, 2009

(65) Prior Publication Data

US 2009/0275475 A1    Nov. 5, 2009

(30) Foreign Application Priority Data

Apr. 25, 2008  (GB) .................................. 0807566.5

(51) Int. Cl.
*H01F 6/06* (2006.01)
(52) U.S. Cl. ........................................ 505/163; 505/160
(58) Field of Classification Search .................. 505/162, 505/160, 163
See application file for complete search history.

(56) References Cited

U.S. PATENT DOCUMENTS

| | | | |
|---|---|---|---|
| 5,956,957 A | 9/1999 | Lowry et al. | |
| 6,043,653 A | 3/2000 | Takamori et al. | |
| 6,437,568 B1 * | 8/2002 | Edelstein et al. | ............. 324/318 |
| 7,057,391 B1 | 6/2006 | Tanabe | |
| 2003/0016018 A1 | 1/2003 | Arz | |
| 2005/0217933 A1 | 10/2005 | Young et al. | |

FOREIGN PATENT DOCUMENTS

| | | |
|---|---|---|
| CN | 1676316 A | 10/2005 |
| GB | 2 437 964 A | 11/2007 |
| JP | 1-208816 A | 8/1989 |
| JP | 10-118043 A | 5/1998 |
| WO | WO 2006/054187 A1 | 5/2006 |

OTHER PUBLICATIONS

British Search Report dated Aug. 12, 2008 (Two (2) pages).

* cited by examiner

*Primary Examiner* — Edward Cain
(74) *Attorney, Agent, or Firm* — Crowell & Moring LLP

(57) ABSTRACT

An annular end piece for a cylindrical vacuum vessel, comprising a metal end piece (42); an outer decorative shell (44) spaced away from a surface of the metal end piece; and a layer of solid foam filling the space between the metal end piece and the outer decorative shell.

13 Claims, 2 Drawing Sheets

VACUUM VESSEL FOR COOLED EQUIPMENT

The present invention relates to an improved vacuum vessel for housing cooled equipment. In particular, the present invention relates to vacuum vessels for housing cooled superconducting magnets of magnetic resonance imaging systems.

Typically, cooled equipment such as a superconducting magnet within a cryogen bath is retained within an outer vacuum container (OVC). The space between the cooled equipment and an inner surface of the OVC is evacuated to provide effective thermal insulation of the cooled equipment.

A magnetic resonance imaging system typically employs a cylindrical superconducting magnet which is housed within a metal, hollow cylindrical OVC—that is, an OVC comprising a cylindrical outer wall, a cylindrical inner 'bore' wall, and annular end pieces joining respective ends of the cylindrical outer wall and the cylindrical inner 'bore' wall. The OVC is typically formed of stainless steel components, welded together.

The present invention relates to an improved type of end piece for OVCs, particularly OVCs whose outer aesthetic appearance is important, such as those used in MRI systems. Within current MRI systems, a strong metal outer vacuum container, (OVC) maintains the internal vacuum environment necessary for the thermal isolation of the superconducting magnet. Separate 'looks' covers are typically provided around the OVC, attached to a supporting frame which is hung from the OVC itself. The looks covers are typically gel-coated, externally decorated, glass-reinforced-plastic (GRP) covers. Such arrangement of 'looks' covers provides an improved aesthetic appearance for the OVC. Another important feature of the arrangement of 'looks' covers is that they provide attenuation of noise from the OVC.

The annular end pieces of an OVC are typically of relatively thick metal such as 8 mm thick stainless steel. Such thickness is conventionally required to resist atmospheric pressure on the outside of the OVC. In MRI systems, a varying magnetic field from gradient coils may cause eddy currents in the material of the OVC: both in the end pieces and in the inner cylindrical 'bore' wall. These eddy currents, in the magnetic field of the magnet, may cause vibration of the end pieces of the OVC, and possibly also of the inner cylindrical 'bore' wall, leading to an acoustic noise which is unpleasant for patients. While it would be advantageous to use a thinner material for the end pieces, in terms of finished system weight and material costs, it is typically found that vibration of the end pieces increases if thinner metal is used. This is especially true on OVCs housing shorter magnets, as the ends of the gradient coil are close to the ends of the OVC.

A conventional arrangement for controlling the noise generated within an MRI system is to fully encapsulate the OVC of the magnet within an arrangement of 'looks' covers and provide a large enough air gap between the 'looks' covers and the vibrating metal OVC to attenuate the generated acoustic vibration. However, and particularly in respect of relatively short OVCs, this attenuation does not work well, and the remaining emitted acoustic noise remains significant.

FIG. 1 shows a general view of an OVC 10 of the prior art, suitable for use in housing a cylindrical superconducting magnet for MRI systems. Features such as access turrets, refrigerator housings and mechanical mounting points, while practically necessary, are not shown in FIG. 1 for clarity. The OVC 10 is made up of a cylindrical outer wall, a cylindrical inner 'bore' wall 14, and annular end pieces 16 joining respective ends of the cylindrical outer wall 12 and the cylindrical inner 'bore' wall 14.

When complete, the OVC will be finished with a surrounding looks cover. FIG. 2 shows a cross-section of that part of the OVC 10 shown at II-II in FIG. 1, when provided with a looks cover.

In FIG. 2, a part of the end piece 16 is shown, provided with looks cover 20, spaced away from an outer surface of the end piece 16 by an air gap 22. A mounting frame 24 is typically provided for attachment of the looks cover 20 by adhesive bonding, clips, through-fasteners such as screws, bolts or rivets, or other suitable attachment means. The brackets are attached to the outer surface of the end piece 16 by any suitable non-perforating means, typically welding, but possibly brazing, soldering or adhesive bonding. Auxiliary equipment such as cables 26 or fluid conduits 28 may be provided, as functionally required by the cooled equipment housed within the OVC. For aesthetic reasons at least, it is preferred that such auxiliary equipment should be mounted between the outer surface of the OVC 16 and the inner surface of the looks cover 20, so as to be hidden from view. Retaining means such as clamp 30 are preferably provided to hold auxiliary equipment 26, 28 in position.

During assembly of the system including OVC 10, significant effort is required to mount the frame 24, clamps 30, auxiliary equipment 26, 28 and looks covers 20 onto the OVC. The end piece is typically welded to the cylindrical walls 12, 14, which is difficult to achieve satisfactorily with a thick end piece as shown in FIG. 2.

The total thickness $t_1$ of the assembly shown in FIG. 2 includes thicknesses of the end piece 16; the air gap 22 and the looks cover 20, and represents the axial length of the finished OVC and looks cover between an inner surface 32 of the end piece 16 and an outer surface 34 of the looks cover 20. In one conventional arrangement, the thickness $t_1$ is about 58 mm, made up of 8 mm thickness of the end piece 16; an air gap 22 of 20 mm and a 30 mm thick looks cover. Most of the thickness of the looks cover is made up of a damping layer of solid foam.

The current configuration of OVC surrounded by a looks cover 20 which is separated from the end pieces 16 by an air gap 22 suffers from a number of disadvantages. Some of these are as follows. The thick metal end pieces 16 of the OVC and the relatively thick, multi-layered GRP composite looks covers are costly to produce, cumbersome to handle, and heavy in weight. A significant number of interface points, such as brackets 24 and clamps 30, are individually attached to the OVC end piece, for example by welding, in order to secure cables 26, conduits 28 and other components positioned between the OVC and the looks cover, which contributes to an overall complicated and time consuming assembly process. The thick metal end pieces 16 of the OVC are required to resist the large vacuum loads, but can interact with a stray magnetic field from the gradient coil to produce acoustic noise and vibration. This is especially troublesome on shorter magnet systems, currently demanded by the market, where each end of the gradient coil is close to an end of the OVC.

The various structural layers and air gaps required and shown in FIG. 2 represent an additional length of the finished OVC and looks cover arrangement. The market seeks ever shorter finished OVC and looks cover arrangements, and the present invention aims to reduce this additional length penalty.

U.S. Pat. No. 4,768,008 describes an OVC in which the inner cylindrical (bore) wall is made up of a thin metal layer, reinforced inside the OVC with a fibreglass-epoxy reinforcing layer. The resultant wall is gas impermeable and may be welded to adjacent OVC components, yet is relatively transparent to magnetic fields generated by gradient coils within the OVC.

U.S. Pat. No. 5,956,957 describes a cryostat for containing a superconducting magnet which is regularly energised and de-energised. To prevent the wasteful generation of eddy currents in the walls of the cryogen vessel and the OVC, these vessels are made of a non-metallic composite material. A further containment vessel is provided to prevent liquid cryogen from contacting the non-metallic composite material.

The present invention aims to provide improved end pieces for OVCs, particularly OVCs housing superconducting magnets for MRI systems. The present invention also provides OVCs comprising such end pieces. The end pieces of the present invention may be more lightweight than the end pieces of the prior art, may provide reduced distance between an inner surface of the OVC and the outer surface of the looks cover, thereby reducing the overall length of a system, and may reduce emitted acoustic noise by reducing the initial vibration of the OVC. The improved end pieces for OVCs may be simpler to assemble into a completed OVC.

Certain embodiments of the present invention provide one or more of the following particular advantages:

Reduced cost and complexity of the system build
Reduced system length
Reduced interaction with gradient stray field
Increased stiffness and increased resonant frequency of the OVC end, which in turn causes reduced acoustic noise.

The present invention accordingly provides end pieces, OVCs, a magnet assembly, methods of manufacturing end pieces and methods of manufacturing OVCs, all as defined in the appended claims.

The above, and further, objects, characteristics and advantages of the present invention will be more apparent from a consideration of the following description of certain embodiments thereof, given by way of example only, with reference to the accompanying drawings, which are not drawn to scale, wherein:

FIG. 3 shows a partial cross-section through an end piece of an OVC, according to the present invention and corresponding to the partial cross-section shown in FIG. 2.

Figure 3:
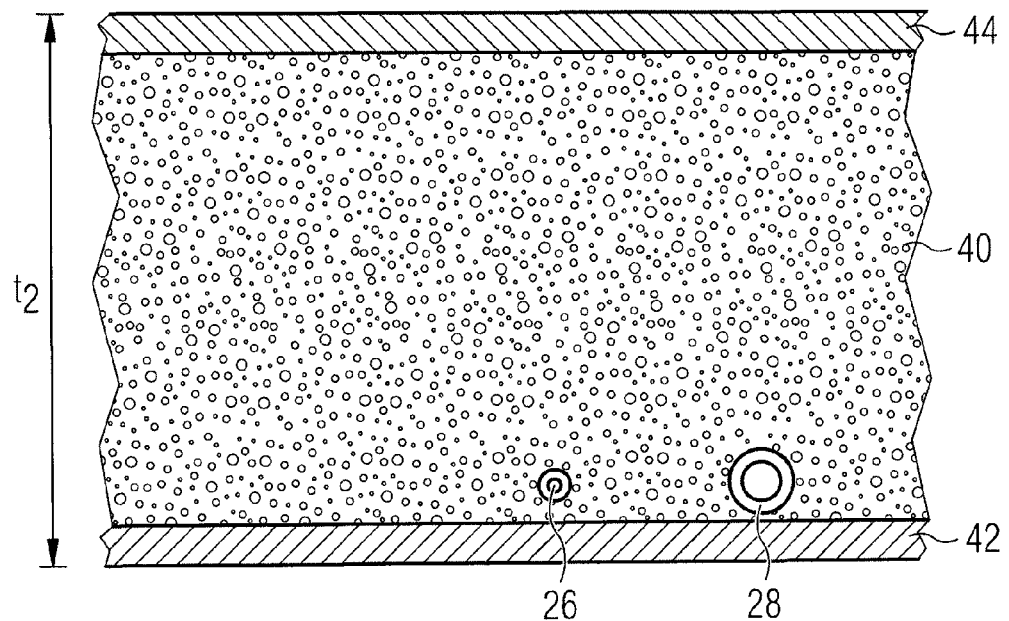
FIG. 3 represents a cross-section through a corresponding part of an end-piece of an OVC according to an embodiment of the present invention.

As shown in FIG. 3, the invention provides a combined OVC end piece with the outer looks cover. The end piece comprises a layer 40 of solid foam, such as polyurethane foam, enclosed between a relatively thin metal OVC end piece 42 and an outer looks cover shell 44. The foam layer 40 may retain and house various fluid conduits 28, cables 26, conduits for cables and other auxiliary equipment. Such auxiliary equipment need not be secured to either the OVC or the looks cover, but may be retained in place by the foam layer 40 alone. This reduces assembly time as compared to the requirement for mounting brackets and clamps of the prior art.

Furthermore, the looks cover 44 may be adhesively bonded to the foam layer, which may itself be adhesively bonded to the metal OVC end piece. This removes the need to provide a framework of brackets for mounting the looks cover, again simplifying assembly, reducing system cost and the overall system complexity and time for assembly.

Preferably, the metal OVC end piece 42 is significantly thinner than the end piece 16 of the prior art. This thinner metal OVC end piece 42 may be formed by a process of spinning (as used in the prior art), or pressing (conventionally considered unsuitable due to the thickness of the conventional end pieces). The thinner metal OVC end piece 42 will reduce the weight and material cost of the OVC and looks cover arrangement. The thinner metal of the end piece would also facilitate welding of the end piece 42 onto the cylindrical walls 12, 14 of the OVC, improving the long term vacuum seal effectiveness required by the OVC. The relatively thin metal of the end piece also reduces the interaction of the end piece with any stray magnetic field from the gradient coil and therefore reduces the gradient-field-induced acoustic vibration. Furthermore, the thinner metal OVC end pieces will have a higher electrical resistance than the conventional OVC end pieces. This will result in reduced eddy currents, and corresponding reduced heating and energy loss.

The looks cover shell 44 may also be thinner and lighter in weight than the conventional looks cover 20. The looks cover shell of the OVC end pieces of the present invention does not have to be self-supporting, but contributes to the strength and rigidity of the inventive OVC end piece as a whole. This thinking contributes to a reduction on material costs.

In one embodiment of the invention, the OVC end piece of the present invention has an overall thickness $t_2$ of about 35 mm, made up of a metal end piece 42 2 mm thick; a 30 mm layer of foam 40 and a 3 mm looks cover shell. This represents a saving of about 23 mm axial length per end as compared to the conventional arrangement mentioned above which has a thickness $t_1$ of about 58 mm. This saving in axial length could be doubled if conventional end piece and looks cover arrangements are replaced by the end piece of the present invention on both ends of an OVC. Such savings in axial length are greatly prized by manufacturers of MRI systems, and are highly sought by the market. Short axial lengths are believed to reduce claustrophobia in patients, increase throughput and improve access to the patient being imaged, making interventional procedures simpler.

Figure 1:
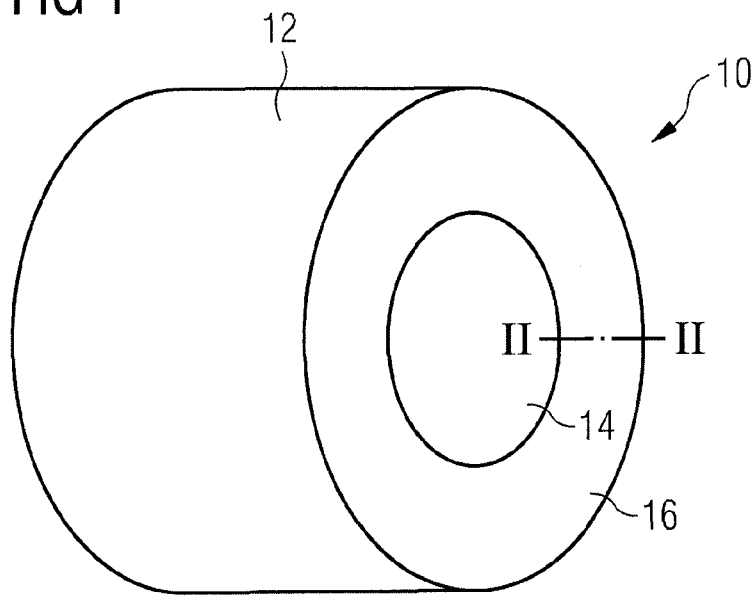
FIG. 1 represents a conventional arrangement of OVC, look covers and included auxiliary equipment.
Figure 2:
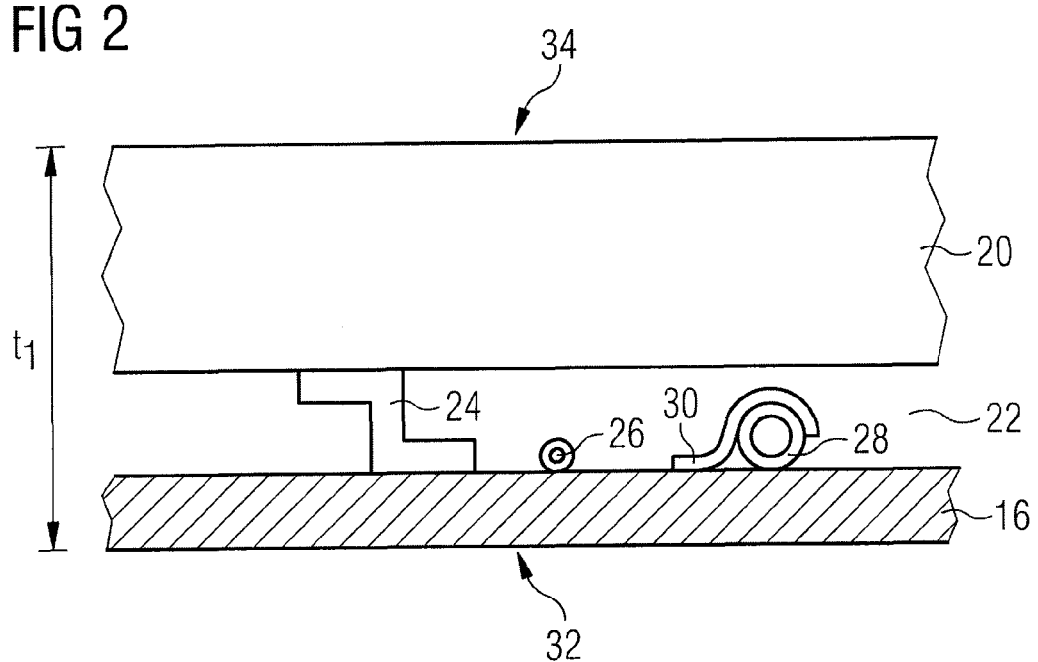
FIG. 2 represents a cross-section through a part of an end-piece of a conventional arrangement such as shown in FIG. 1.

In a preferred embodiment, the three layers within the end piece of the invention (the metal end piece 42, the foam layer 40 and the looks cover shell 44) are rigidly bonded together, preferably with no air gaps. The overall thickness $t_2$ of the end piece of the invention is reduced in comparison to the thickness $t_1$ of the end piece of the conventional configuration (FIG. 2). Use of the end piece of the present invention may accordingly reduce the overall system length. By bonding the looks cover shell 44 to the foam layer 40 and so also to the metal OVC end piece 42, the risk of creep effects (deformation) of the material of the looks cover 44 is reduced, as the looks cover 44 is held firmly in position by the foam layer 40 and the OVC end piece 42.

The material of the foam layer should be selected appropriately to withstand the expected mechanical stress, without unnecessarily adding weight. The inventors propose a combination of so-called low-density foam, typically having a density of about 80 kg·m$^{-3}$ and so-called high-density foam, typically having a density of about 200 kg·m$^{-3}$, in different regions of the end piece according to an anticipated stress distribution. Suitable foam materials may be obtained from DIAB International AB under the name DIVINYCELL®, www.diabqroup.com.

Despite the end piece of the present invention being thinner, lighter and more cost-effective than the arrangement of the prior art, the overall effective stiffness of the end piece will at least be comparable to the current metal end piece 16 of the OVC, as the whole thickness $t_2$ acts as a single piece. This stiffness combined with the reduction in mass for the end piece results in a higher resonant frequency for the end piece which could improve the overall performance in relation to gradient induced vibration, by taking the resonant frequency of the end piece away from the critical frequency range in which the end piece vibration dominates in regard to the overall system acoustic noise spectrum.

One possible method for the manufacture of the end piece of the present invention is as follows:

The metal OVC end piece 42 is formed by conventional spinning techniques, or is formed by pressing. Solid foam 40 is cut and shaped and adhesively bonded to the outer surface of the metal end piece 42.

Indents may be pre-formed in the solid foam to accommodate cables, conduits or other components as discussed earlier. Typically, such cables conduits and components may include fluid conduits carrying cooling fluid for gradient coil cooling, and cables connected to RF coils used in MRI systems.

Glass-fibre matting or felt is then laid on top of the foam 42. The glass fibre may be dry, or may already be wetted with resin.

An external mould is laid on the glass fibre matting or felt.

The assembly is placed within a vacuum bag which is then evacuated to compress the structure and drive out any air.

If the glass fibre matting or felt was laid dry, then resin would be injected whilst the assembly is under vacuum. The resin is cured to form the looks cover shell 44 as a solid layer bonded to the foam. The cured resin may serve to assist in bonding the foam layer 40 to the metal end piece 42.

The vacuum bag and mould are removed and the external surface of the GRP looks cover is finished appropriately. A decorative gel coat layer may be applied to the cured GRP layer, or may be applied to the inner surface of the mould before the mould is placed on the glass fibre matting or felt.

In an alternative method, the metal end piece 42 is again formed by conventional spinning techniques, or is formed by pressing. A suitable looks cover mould is lined, firstly with a gel coat layer, and then with layers of resin-impregnated glass fibre matting or felt, and the resulting structure cured to form a looks cover shell 44 within the mould. With the looks cover shell still in its mould, the metal end piece 42 is positioned in the appropriate spatial relationship with the looks cover shell 44. Any cables conduits and other components to be located within the foam are also placed in position. Then, an expanding foam material is injected into the gap between the outer surface of the metal end cap 42 and the inner surface of the looks cover shell 44. The expanding foam expands to fill the gap between the looks cover shell and the metal end piece, and bonds all three layers together. Once the foam has cured, the mould may be removed to reveal the finished OVC end piece. By keeping the mould in place, foam is prevented from contaminating the decorative exterior surface of the looks cover shell. The expanding foam will fill the spaces around any cables, conduits or other components to hold them in position within the foam as discussed earlier.

The foam layer 40 and looks cover shell 44 may be applied by one of these methods, or any other suitable method, to the metal OVC end cap as a component of an OVC to be assembled later. Alternatively, the whole OVC may be assembled, including metal end caps 42, with the foam layer and looks cover shell applied later.

Whichever assembly method is used, it is clear to one skilled in the art that reinforcement materials other than glass fibre may be used, such as carbon fibre or aramid fibre, such as available under the brand name Kevlar® from E.I. du Pont de Nemours and Company.

The proposed solution combines the functions of the conventional OVC end piece with the outer looks cover. This removes the need for separate end looks covers 20 and their supporting frame 24, which reduces system cost and the overall system complexity and time required for assembly.

The foam layer 40 is effective at damping vibrations and attenuating acoustic noise. It can house various conduits, cables and components without the need for further fixing means, and so reduce assembly time and complexity.

In some embodiments, structural features may be bonded into the foam gap, for example by adhesive bond to solid foam, or by including the structural features in the mould when foam in introduced and cured. An example of this is a body coil bracket which could simply consist of either one plate or a number of individual bosses, and may be retained by the foam in position to retain the body coil within the bore of the OVC, to be covered by a substantially cylindrical bore wall looks cover.

Figure 4:
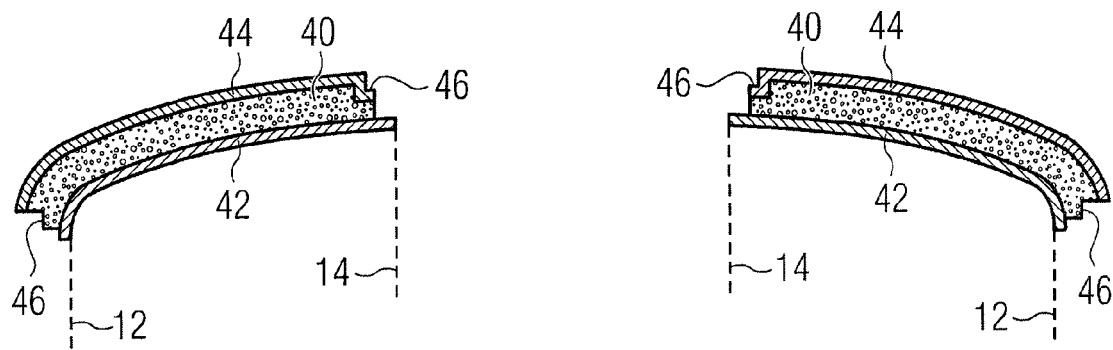
FIG. 4 represents a cross-section through an end-piece of an OVC according to an embodiment of the present invention.

FIG. 4 shows a cross-section of a completed OVC end piece of the present invention, comprising a layered structure of a metal OVC end piece 42; a foam layer 40 and looks cover shell 44. Shown in phantom are the outer 12 and inner 14 cylindrical walls of the OVC. FIG. 4 shows exposed portions of the metal end piece 42 for welding to the cylindrical walls. In the embodiment illustrated in FIG. 4, conventional looks covers are to be placed over the cylindrical walls 12, 14 of the OVC, and steps 46 in the foam layer 40 provide recesses for an edge portion of adjacent looks cover panels, enabling an effective flush join. The looks cover shell 44 may be extended to cover at least part of the surface of these steps 46. Substantially cylindrical looks covers may then be applied in the conventional manner to cylindrical outer wall 12 and cylindrical bore wall 14. As is conventional, a 'funnel' piece may be used to cover a gap between the substantially cylindrical bore wall looks cover and the end piece of the present invention. Such funnel piece channels cables and/or conduits etc. through to a space between the inner bore and its looks cover without exposing them, to maintain the flush external finish.

If desired, a translucent or transparent cover, such as of thermoformed acrylic, may be attached over the looks cover shell. Display material such as advertising, user information, or images believed to calm patients may be applied between the looks cover shell and the translucent cover. Such cover need only be self-supporting and need take no part in the structural integrity of the OVC end cover of the invention.

A control panel is conventionally mounted on the looks cover of an end of the OVC. With the OVC end pieces of the present invention, such control panels may be accommodated by routing the required connecting wires through the foam layer and through the looks cover shell. Alternatively, the control panel may be arranged to project beyond the end piece of the present invention, with the required connecting wires not passing through the end piece of the present invention.

The invention claimed is:

1. An annular end piece for a cylindrical vacuum vessel, comprising
    a metal end piece;
    a resin-impregnated fiber outer decorative shell spaced away from a surface of the metal end piece; and
    a layer of solid foam adhesively bonded to, and filling the space between the metal end piece and the resin-impregnated fiber outer decorative shell.

2. An annular end piece according to claim 1, wherein at least one of:

a cable;
a conduit;
another component
is embedded within the solid foam.

3. An annular end piece according to claim 1, wherein the layer of solid foam comprises at least two different types of foam, two of the different types of foam having different mass densities.

4. A cylindrical vacuum vessel comprising a cylindrical outer wall, a cylindrical inner 'bore' wall, and annular end pieces according to claim 1, joining respective ends of the cylindrical outer wall and the cylindrical inner 'bore' wall.

5. A magnet assembly for a magnetic resonance imaging (MRI) system, comprising a cylindrical superconductive magnet housed within a cylindrical vacuum vessel according to claim 4, and a gradient coil housed within the bore of the cylindrical vacuum vessel.

6. A method for manufacturing an annular end piece for a cylindrical vacuum vessel, comprising the steps of:
 providing a metal end piece;
 providing at least one piece of solid foam;
 adhesively bonding the piece of solid foam to an outer surface of the metal end piece;
 laying uncured, resin-impregnated fiber material on top of the solid foam;
 applying an external mould on the uncured, resin-impregnated fiber material; and
 curing the resin-impregnated fiber material to form a looks cover shell as a solid layer bonded to the foam.

7. A method for manufacturing an annular end piece for a cylindrical vacuum vessel, comprising the steps of:
 providing a metal end piece;
 providing at least one piece of solid foam;
 adhesively bonding the piece of solid foam to an outer surface of the metal end piece;
 laying fiber material on top of the solid foam;
 applying an external mould on the fiber material;
 introducing an uncured resin into the fiber material; and
 curing the resin-impregnated fiber material to form a looks cover shell as a solid layer bonded to the foam.

8. A method according to claim 6, wherein indents are pre-formed in the solid foam for accommodating cables, conduits or other components.

9. A method for manufacturing an annular end piece for a cylindrical vacuum vessel, comprising the steps of:
 providing a metal end piece;
 lining a mould with a gel coat layer, and then with layers of uncured, resin-impregnated fiber material;
 curing the resin-impregnated fiber material to form a looks cover shell as a solid layer;
 positioning the metal end piece in an appropriate spatial relationship with the looks cover shell;
 introducing an expanding foam material into the gap between the outer surface of the metal end cap and the inner surface of the looks cover shell, such that the expanding foam expands to fill the gap between the looks cover shell and the metal end piece, and bonds to the looks cover shell and the metal end piece;
 curing the expanding foam.

10. A method according to claim 6, wherein the metal end piece is formed by spinning techniques, or by pressing.

11. A method according to claim 6, wherein the fiber material is selected from among the group consisting of glass fiber matting; glass fiber felt; carbon fiber matting; carbon fiber felt; aramid fiber matting; aramid fiber felt.

12. A method of manufacturing a cylindrical vacuum vessel comprising the steps of: providing a cylindrical outer wall, a cylindrical inner 'bore' wall, and annular end pieces, at least one of which is an end piece according to claim 1, and joining respective ends of the cylindrical outer wall and the cylindrical inner 'bore' wall by the annular end pieces.

13. A method of manufacturing a cylindrical vacuum vessel comprising the steps of: providing a cylindrical outer wall, a cylindrical inner 'bore' wall, and annular metal end pieces, and joining respective ends of the cylindrical outer wall and the cylindrical inner 'bore' wall by the annular end pieces to form a closed vessel;
 characterized in that the method further comprises manufacturing at least one end piece according to claim 6, using one of the annular metal end piece of the closed vessel as the metal end piece.

* * * * *